(12) United States Patent
Ito et al.

(10) Patent No.: US 11,618,936 B2
(45) Date of Patent: Apr. 4, 2023

(54) CEMENTED CARBIDE, COATED TOOL USING SAME, AND CUTTING TOOL

(71) Applicant: KYOCERA CORPORATION, Kyoto (JP)

(72) Inventors: Hirotoshi Ito, Satsumasendai (JP); Kou Ri, Satsumasendai (JP); Tadashi Katsuma, Satsumasendai (JP)

(73) Assignee: KYOCERA Corporation, Kyoto (JP)

(*) Notice: Subject to any disclaimer, the term of this patent is extended or adjusted under 35 U.S.C. 154(b) by 151 days.

(21) Appl. No.: 17/042,976

(22) PCT Filed: Mar. 29, 2019

(86) PCT No.: PCT/JP2019/014031
§ 371 (c)(1),
(2) Date: Sep. 29, 2020

(87) PCT Pub. No.: WO2019/189774
PCT Pub. Date: Oct. 3, 2019

(65) Prior Publication Data
US 2021/0016362 A1    Jan. 21, 2021

(30) Foreign Application Priority Data
Mar. 29, 2018  (JP) .............................. JP2018-063955

(51) Int. Cl.
*B23B 27/14*   (2006.01)
*C22C 29/08*   (2006.01)
(Continued)

(52) U.S. Cl.
CPC ............ *C22C 29/08* (2013.01); *B23B 27/148* (2013.01); *B23B 27/1611* (2013.01);
(Continued)

(58) Field of Classification Search
CPC ... B23B 27/14; B23B 27/148; B23B 27/1611; C22C 29/08; C22C 29/067
(Continued)

(56) References Cited

U.S. PATENT DOCUMENTS 6,456,054 B1 * 9/2002 Kataoka ................ B23B 27/145
73/104
2009/0242824 A1 * 10/2009 Akesson ............. C23C 14/0641
419/14
2017/0259344 A1    9/2017 Detani et al.

FOREIGN PATENT DOCUMENTS

CN    106856658 A    6/2017
JP    H07112313 A    5/1995
(Continued)

OTHER PUBLICATIONS

Weidow et al., "APT analysis of WC—Co based cemented carbides", Feb. 2011, Ultramicroscopy, vol. 111, pp. 595-599 (Year: 2011).*

(Continued)

*Primary Examiner* — Seth Dumbris
(74) *Attorney, Agent, or Firm* — Viering, Jentschura & Partner mbB

(57) ABSTRACT

A cemented carbide may include a hard phase including W and C, and a binder phase including cubic Co. The binder phase may include Zr. The Co may include a lattice constant of more than 3.5575 Å and not more than 3.5600 Å. A coated tool may include a coating layer located on a surface of the cemented carbide. A cutting tool may include a holder that is extended from a first end toward a second end and may include a pocket on a side of the first end, and the coated tool located in the pocket.

7 Claims, 3 Drawing Sheets

(51) Int. Cl.
*B23B 27/16* (2006.01)
*C23C 16/40* (2006.01)
*C23C 16/34* (2006.01)
*C23C 16/36* (2006.01)
*C22C 29/06* (2006.01)

(52) U.S. Cl.
CPC ............ *C22C 29/067* (2013.01); *C23C 16/34* (2013.01); *C23C 16/36* (2013.01); *C23C 16/403* (2013.01); *B23B 2222/04* (2013.01); *B23B 2222/88* (2013.01); *B23B 2228/10* (2013.01)

(58) Field of Classification Search
USPC .......................................................... 428/698
See application file for complete search history.

(56) References Cited

FOREIGN PATENT DOCUMENTS

| | | |
|---|---|---|
| JP | H11207515 A | 8/1999 |
| JP | 2003129165 A | 5/2003 |
| JP | 2003277873 A | 10/2003 |
| JP | 2017113835 A | 6/2017 |
| RU | 2647957 * | 3/2018 |
| WO | 2017061058 A1 | 4/2017 |

OTHER PUBLICATIONS

Soria et al., "An investigation into the effects of HIP after sintering of WC—ZrC—Co—$Cr_3C_2$ cemented carbides", Nov. 2019, International Journal of Refractory Metals & Hard Materials), vol. 87, 105164 (Year: 2019).*

* cited by examiner

CEMENTED CARBIDE, COATED TOOL USING SAME, AND CUTTING TOOL

CROSS-REFERENCE TO RELATED APPLICATIONS

This application is a national stage entry according to 35 U.S.C. 371 of PCT Application No. PCT/JP2019/014031 filed on Mar. 29, 2019, which claims priority to Japanese Application No. 2018-063955 filed on Mar. 29, 2018, which are entirely incorporated herein by reference.

TECHNICAL FIELD

The present disclosure relates to a cemented carbide, a coated tool using the cemented carbide, and a cutting tool.

BACKGROUND

A cemented carbide including WC as a hard phase can be used for end mills or the like. Patent Document 1 discusses as follows: A satisfactory tool lifetime is attainable under special cutting conditions by which a cutting edge is subjected to high temperature, by using WC, and Co as a binder phase, and by controlling so that a content of the Co is 3-10 wt % and a lattice constant of the Co is 3.565-3.575 Å.

Patent Document 2 discusses that a cutting tool suitable for a high-speed milling process is achievable by controlling a lattice constant of Co within a range of 3.524-3.545 Å.

Patent Document 1: Japanese Unexamined Patent Publication No. 11-207515
Patent Document 2: Japanese Unexamined Patent Publication No. 7-112313

SUMMARY

A cemented carbide in the present disclosure may include a hard phase including W and C, and a binder phase including cubic Co. The binder phase may include Zr. The Co may include a lattice constant of more than 3.5575 Å and not more than 3.5600 Å. A coated tool in the present disclosure may include a coating layer located on a surface of the cemented carbide. A cutting tool in the present disclosure may include a holder that is extended from a first end toward a second end and may include a pocket on a side of the first end, and the coated tool located in the pocket.

DETAILED DESCRIPTION

Figure 1:
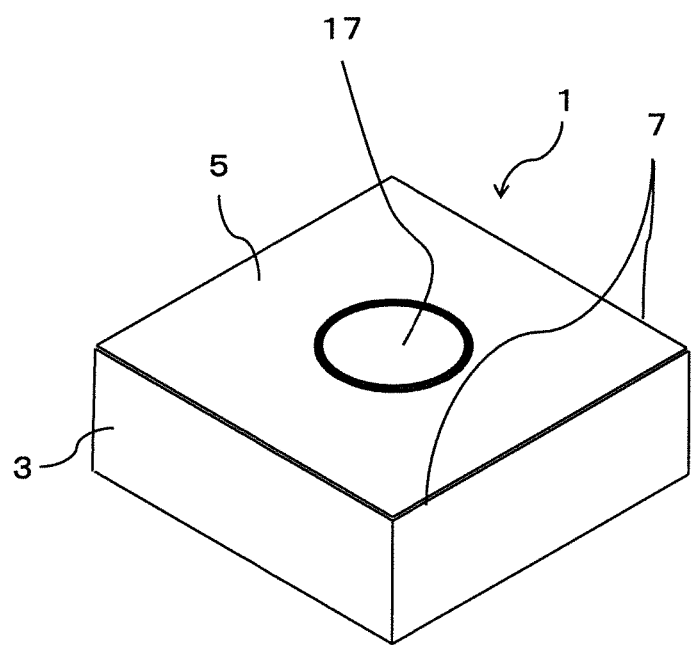
FIG. 1 is a perspective view illustrating a non-limiting embodiment of a coated tool in the present disclosure.

A cemented carbide in the present disclosure includes a hard phase including W and C, and a binder phase including cubic Co. The binder phase includes Zr, and a lattice constant of the Co is more than 3.5575 Å and not more than 3.5600 Å.

The cemented carbide having the above structure is less susceptible to plastic deformation at high temperatures. The cemented carbide also has high hardness and is therefore suitable for use as a tool. The cemented carbide in the present disclosure is less susceptible to plastic deformation at high temperatures and not susceptible to excessive chipping because the Co includes the Zr even in a region where the lattice constant of the Co is more than 3.5575 Å and not more than 3.5600 Å. The region has conventionally been avoided due to occurrence of chipping.

Specifically, the Zr is a solid-solute in the Co that is the binder phase, and the lattice constant of the Co changes due to a solid solution. The solid solution may be verified by, for example, observing the binder phase composed mainly of the Co in a cross section of the cemented carbide so as to check whether the Co and the Zr are included in the binder phase by EDX or the like.

Although a detailed reason for this is unclear, the fact that the Co includes the Zr seems to contribute to reducing plastic deformation even at the lattice constant that has conventionally been considered improper.

Alternatively, the lattice constant of the Co may be 3.5580-3.5595 Å. The plastic deformation at high temperatures is further reducible by controlling the lattice constant to the above range.

The hard phase included in the cemented carbide is, for example, WC particles in the present disclosure. The hard phase may include 90 mass % or more of WC, and the rest that is other solid solution elements. Examples of the solid solution elements include Al and Cr. A content of the hard phase may be controlled to 80-95 mass %. Hardness suitable for use as a tool is obtainable by controlling the content to the above range.

The cemented carbide may include 0.75-1.0 mass % of the Zr in terms of ZrC in the present disclosure. The cemented carbide is less susceptible to plastic deformation by controlling the Zr to the above range.

The cemented carbide may include 1.0-3.0 mass % of Ti in terms of TiC in the present disclosure. With the above structure, the binder phase has improved high temperature characteristics and therefore becomes less susceptible to plastic deformation even in high speed machining. Alternatively, the cemented carbide may include 2.0-3.0 mass % of Ti in terms of TiC.

The cemented carbide may include 0.1-5.0 mass % of Ta in terms of TaC in the present disclosure. With the above structure, the binder phase has improved high temperature characteristics and therefore becomes less susceptible to plastic deformation even in the high speed machining. Alternatively, the cemented carbide may include 1.0-3.0 mass % of Ta in terms of TaC.

The cemented carbide includes, as the rest, the Co that is the binder phase.

The cemented carbide is less susceptible to plastic deformation at high temperatures in the present disclosure as described above. The cemented carbide has the high hardness by including the hard phase. Because of these characteristics, the cemented carbide in the present disclosure is suitable for a base body of a coated tool.

The coated tool includes a coating layer located on a surface of the cemented carbide in the present disclosure. FIG. 1 is a perspective view illustrating a non-limiting embodiment of the coated tool in the present disclosure. The coated tool 1 in the present disclosure has a plate shape whose main surface has an approximately quadrangular shape in the non-limiting embodiment illustrated in FIG. 1. However, there is no intention to limit to this shape. An upper surface is a rake surface in FIG. 1, and a side surface is a flank surface in FIG. 1. A cutting edge 7 is formed on a ridge part between the upper surface and the side surface.

In other words, the coated tool includes the cutting edge 7 located on at least a part of a ridgeline where the rake surface intersects with the flank surface.

Although the entirety of an outer periphery of the rake surface may correspond to the cutting edge 7 in the coated tool 1, the coated tool 1 is not limited to the above. For example, the cutting edge 7 may be located on only one side or may be located partially on the rake surface having the quadrangular shape.

Dimensions of the coated tool 1 are not particularly limited. For example, a length of one side of the rake surface is settable to approximately 3-20 mm. A thickness of the coated tool 1 is settable to, for example, approximately 3-20 mm.

The coated tool 1 may include a through hole 17 extended from the upper surface to the lower surface in FIG. 1.

Figure 2:
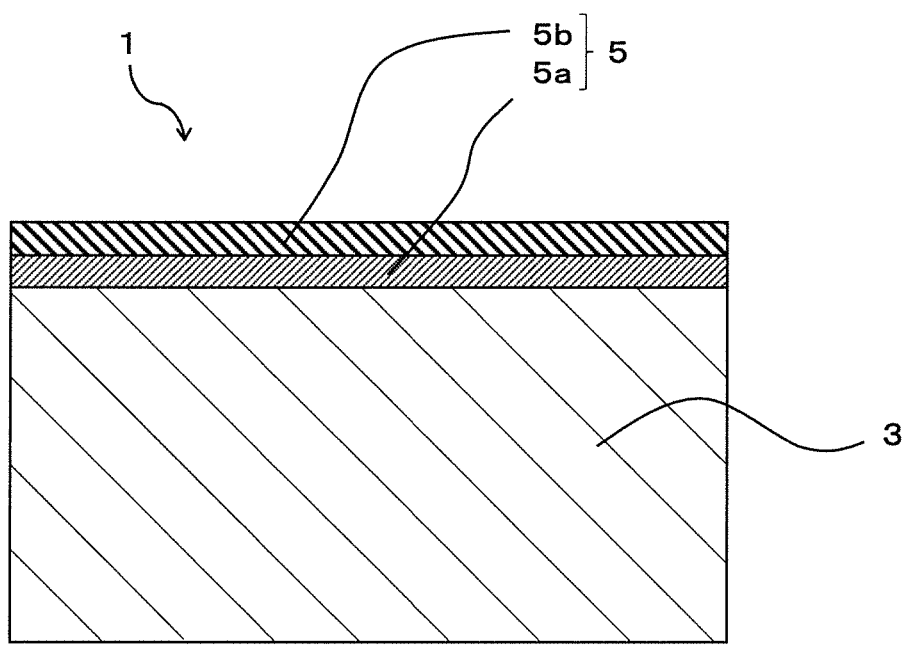
FIG. 2 is an enlarged cross sectional view illustrating surroundings of a surface of the coated tool in the present disclosure.

The coated tool 1 includes the coating layer 5 on the surface of the base body 3 composed of the cemented carbide in the present disclosure as illustrated in FIG. 2. The coating layer 5 located on the surface of the base body 3 is formable by PVD or CVD.

The coating layer 5 may be a multilayer, and may include, for example, a TiCN layer 5a and an $Al_2O_3$ layer 5b in this order from a side of the base body 3. Alternatively, the coating layer 5 may include, for example, a TiN layer (not illustrated), a TiCN layer 5a and an $Al_2O_3$ layer 5b in this order from the side of the base body 3. The coated tool 1 in the present disclosure employs, as the base body 3, the cemented carbide less susceptible to plastic deformation, and further includes the coating layer 5. The coated tool 1 is therefore suitable for the high speed machining because the coated tool 1 in the present disclosure employs, as the base body 3, the cemented carbide less susceptible to plastic deformation, and further includes the coating layer 5. The coating layer 5 may not cover the entire surface of the base body 3, but may cover at least a part of the surface of the base body 3, particularly a surface of a region used as the cutting edge 7.

Figure 3:
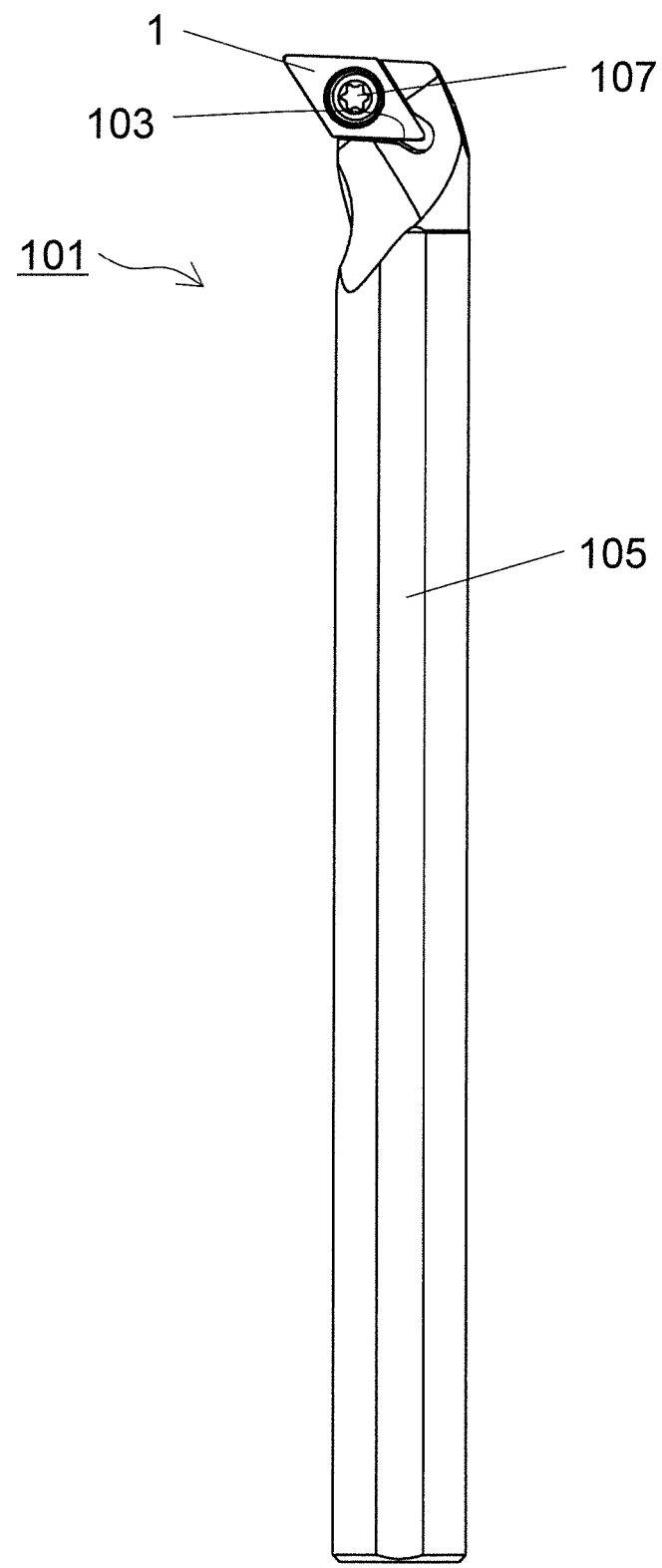
FIG. 3 is a plan view illustrating a non-limiting embodiment of a cutting tool in the present disclosure.

A cutting tool in the present disclosure is described with reference to the drawings. The cutting tool 101 has, for example, a bar-shaped body extended from a first end (an upper end in FIG. 3) toward a second end (a lower end in FIG. 3) in the present disclosure as illustrated in FIG. 3. The cutting tool 101 includes a holder 105 including a pocket 103 on a side of the first end (a front end side), and the coated tool 1 located in the pocket 103 as illustrated in FIG. 3. The cutting tool 101 includes the coated tool 1 and is therefore capable of carrying out a stable cutting process over a long term.

The pocket 103 is a part that permits attachment of the coated tool 1. The pocket 103 includes a seating surface parallel to a lower surface of the holder 105, and a constraining lateral surface inclined relative to the seating surface. The pocket 103 opens into a side of the first end of the holder 105.

The coated tool 1 is located in the pocket 103. A lower surface of the coated tool 1 may be in a direct contact with the pocket 103. Alternatively, a sheet (not illustrated) may be held between the coated tool 1 and the pocket 103.

The coated tool 1 is attached to the holder 105 so that at least a part of a region used as the rake surface and the cutting edge 7 is protruded outward from the holder 105. The coated tool 1 is attached to the holder 105 by a screw 107 in the present non-limiting embodiment. Specifically, the coated tool 1 is attachable to the holder 105 in such a manner that screw parts are engaged with each other by inserting the screw 107 into the through hole 17 of the coated tool 1, and by inserting a front end of the screw 107 into a screw hole (not illustrated) formed in the pocket 103.

For example, steel and cast iron are usable as a material of the holder 105. Of these materials, high toughness steel may be used.

The present non-limiting embodiment has illustrated and described the cutting tool 101 for use in a so-called turning process. Examples of the turning process include inner diameter processing, outer diameter processing and grooving process. The cutting tool 101 is not limited to ones which are used for the turning process. For example, the coated tool 1 of the above non-limiting embodiment may be used for a cutting tool for use in a milling process.

A method for manufacturing the cemented carbide in the present disclosure is described below.

WC powder, Co powder, ZrC powder and TiC powder are prepared as raw material powders. A mean particle diameter of the raw material powders may be suitably selected in a range of 0.1-10 μm.

The WC powder may be controlled within a range of 80-92.5 mass %. The ZrC powder may be controlled within a range of 0.5-2.0 mass %. The TiC powder may be controlled within a range of 1.0-4.0 mass %. NbC powder may be controlled within a range of 0-5 mass %. TaC powder may be controlled within a range of 0-5 mass %. The rest may be Co powder. The NbC powder and the TaC powder may be added, if desired.

These raw material powders are mixed together and molded, followed by debinding treatment. This is then sintered at 1450-1600° C. for 30-180 minutes in a non-oxidizing atmosphere, such as vacuum, argon atmosphere and nitrogen atmosphere, thereby obtaining the cemented carbide in the present disclosure.

The cutting tool in the present disclosure is obtainable by bringing the cemented carbide into a shape of the main body of the coated tool, and by depositing a coating film on a surface of the main body.

The sliding properties and wear resistance of the coated tool can be improved by depositing the coating layer by CVD method. As the coating layer deposited by CVD method, 3-15 μm of a TiCN layer and 1-15 μm of an $Al_2O_3$ layer may be formed on the surface of the cemented carbide in this order from a side of the cemented carbide.

Alternatively, 0.1-1.5 μm of a TiN layer, 3-15 μm of a TiCN layer and 1-15 μm of an $Al_2O_3$ layer may be formed on the surface of the cemented carbide in this order from the side of the cemented carbide.

Although the cemented carbide in the present disclosure, the coated tool using the cemented carbide, and the cutting tool have been described above, the present disclosure may be subject to various changes besides the above non-limiting embodiments.

EXAMPLES

Examples of the present disclosure are specifically described below.

Cemented carbides respectively having compositions presented in Table 1 were manufactured by mixing WC powder, Co powder, ZrC powder, TiC powder, TaC powder and Cr powder together in their respective proportions, and by leaving a molded body thus manufactured at a temperature of 1520° C. for two hours, followed by sintering. Each of compositions is presented by converting elements included in a sintered body to a compound in Table 1. Mean particle diameters of the raw material powders were as follows. The mean particle diameter of WC was 3 μm, that of Co was 1.5

μm, and those of TiC, ZrC, TaC and Cr were all 1 μm. A crystal phase of the Co included in the cemented carbide was determined by using XRD. A solid solution phase of a lattice constant of Co was also evaluated. The crystal phases of the Co included in the obtained cemented carbides were all cubic crystals. ZrC was not used but Cr was added in Sample No. 1. A lattice constant of each of samples is presented in Table 1.

In Sample No. 1 in which the lattice constant of Co exceeded 3.5575 Å and Zr was not included, displacement in the creep test was large and plastic displacement was large. A fracture occurred relatively early, and an amount of wear was large.

In Sample No. 2 in which the lattice constant of Co was less than 3.5575 Å, an absolute value of displacement in the

TABLE 1

| Sample No. | WC (wt %) | Co (wt %) | ZrC (wt %) | TiC (wt %) | TaC (wt %) | Cr (wt %) | Lattice constant of Co (Å) | Displacement in creep test (mm) | Result of fracture test (times) | Result of wear test (min) |
| --- | --- | --- | --- | --- | --- | --- | --- | --- | --- | --- |
| 1 | 90.8 | 7.5 | 0 | 0 | 0.8 | 0.9 | 3.5580 | −0.129 | 5000 | 15 |
| 2 | 89 | 7.5 | 0.5 | 3 | 0 | 0 | 3.5548 | −0.110 | 8000 | 20 |
| 3 | 88.75 | 7.5 | 0.75 | 3 | 0 | 0 | 3.5576 | −0.082 | 10000 | 32 |
| 4 | 88.5 | 7.5 | 1 | 3 | 0 | 0 | 3.5584 | −0.075 | 12000 | 35 |
| 5 | 88 | 7.5 | 1.5 | 3 | 0 | 0 | 3.5592 | −0.071 | 11000 | 37 |
| 6 | 87.5 | 7.5 | 2 | 3 | 0 | 0 | 3.5598 | −0.060 | 11000 | 39 |
| 7 | 87 | 7.5 | 2.5 | 3 | 0 | 0 | 3.5610 | −0.060 | 2000 | 18 |

High temperature characteristics of the cemented carbides were evaluated. The high temperature characteristics of the cemented carbides were evaluated by a high temperature creep test under the following conditions. Displacement in the high temperature creep test is presented in Table 1. A negative value increases with increasing plastic deformation in results of the high temperature creep test. Accordingly, an absolute value of a measured value is close to zero if the plastic deformation is small. The absolute value of the measured value is large if the plastic deformation is large.

<Hight Temperature Creep Test>
　Temperature: 900° C.
　Load: 9 kN
　Atmosphere: Argon
　Evaluation Method: Measuring displacement after the load was applied and held for four hours Further, samples in the shape of CNMG120408 were individually formed using the compositions presented in Table 1, and 0.5 μm of a TiN film, 7 μm of a TiCN film and 5 μm of an $Al_2O_3$ film were individually deposited to manufacture a coated tool. A cutting test was carried out under the following conditions.

<Cutting Test>
(1) Fracture Resistance Evaluation
　Cutting Conditions
　Machining Type: Turning
　Cutting Speed: 300 m/min
　Feed: 0.3 mm/rev
　Depth of Cut: 1.5 mm
　Workpiece: SCM440 Round rod of ϕ200 with four grooves
　Machining State: WET
　Evaluation Item: The number of impacts at which a fracture occurred
(2) Wear Resistance Evaluation
　Cutting Conditions
　Machining Type: Turning
　Cutting Speed: 300 m/min
　Feed: 0.3 mm/rev
　Depth of Cut: 2.0 mm
　Workpiece: SCM435 Round rod of ϕ200
　Machining State: WET
　Evaluation Item: Cutting time at which a wear width of a flank surface reached 0.3 mm creep test was large, a fracture occurred relatively early, and an amount of wear was large.

In Sample No. 7 in which the lattice constant of Co exceeded 3.5600 Å, an absolute value of displacement in the creep test was small. However, a fracture occurred relatively early, and an amount of wear was large.

In Samples Nos. 3 to 6 in which Co included Zr and the lattice constant of the Co was more than 3.5575 Å and not more than 3.5600 Å, plastic displacement was small, a fracture occurred relatively late, and an amount of wear was small.

While the non-limiting embodiments in the present disclosure have been described, the present disclosure is not limited to the above non-limiting embodiments, and various improvements and changes may be made without departing from the spirit and scope of the present disclosure.

Description of the Reference Numerals

1 coated tool
3 base body
5 coating layer
5a TiCN layer
5b $Al_2O_3$ layer
17 through hole
101 cutting tool
103 pocket
105 holder
107 screw

The invention claimed is:
1. A cemented carbide, comprising:
　a hard phase comprising W and C; and
　a binder phase comprising cubic Co,
　　the binder phase further comprising Zr, with Zr in a solid solution with the cubic Co, and
　　the cubic Co with the Zr in the solid solution comprising a lattice constant of more than 3.5575 Å and not more than 3.5600 Å.
2. The cemented carbide according to claim 1, wherein the lattice constant of the cubic Co with the Zr in the solid solution is 3.5580-3.5595 Å.
3. The cemented carbide according to claim 1, wherein a content of Zr in the cemented carbide is 1.0 or more mass % and 1.5 or less mass %.

4. A coated tool, comprising:
a coating layer located on a surface of the cemented carbide according to claim 1.
5. The coated tool according to claim 4, wherein
the coating layer comprises a TiCN layer and an $Al_2O_3$ layer in this order from a side of the cemented carbide.
6. The coated tool according to claim 4, wherein
the coating layer comprises a TiCN layer, a TiN layer, and an $Al_2O_3$ layer in this order from a side of the cemented carbide.
7. A cutting tool, comprising:
a holder that is extended from a first end toward a second end and comprises a pocket on a side of the first end; and
the coated tool according to claim 4, the coated tool being located in the pocket.

\* \* \* \* \*